US010074428B2

(12) United States Patent
Shiozawa et al.

(10) Patent No.: US 10,074,428 B2
(45) Date of Patent: Sep. 11, 2018

(54) OPTICAL RECORDING DEVICE, OPTICAL RECORDING METHOD, AND INFORMATION RECORDING MEDIUM (71) Applicant: Hitachi, Ltd., Tokyo (JP)

(72) Inventors: Manabu Shiozawa, Tokyo (JP); Yasuhiko Shimotsuma, Kyoto (JP); Masaaki Sakakura, Kyoto (JP); Kiyotaka Miura, Kyoto (JP); Miki Nakabayashi, Kyoto (JP)

(73) Assignee: Hitachi, Ltd., Tokyo (JP)

( * ) Notice: Subject to any disclaimer, the term of this patent is extended or adjusted under 35 U.S.C. 154(b) by 11 days.

(21) Appl. No.: 14/653,547

(22) PCT Filed: Dec. 21, 2012

(86) PCT No.: PCT/JP2012/083195
§ 371 (c)(1),
(2) Date: Jun. 18, 2015

(87) PCT Pub. No.: WO2014/097467
PCT Pub. Date: Jun. 26, 2014

(65) Prior Publication Data
US 2015/0302926 A1 Oct. 22, 2015

(51) Int. Cl.
G11B 7/0065 (2006.01)
G11C 13/04 (2006.01)
(Continued)

(52) U.S. Cl.
CPC .......... *G11C 13/042* (2013.01); *G11B 7/0065* (2013.01); *G11B 7/00455* (2013.01);
(Continued)

(58) Field of Classification Search
None
See application file for complete search history.

(56) References Cited

U.S. PATENT DOCUMENTS 5,412,592 A * 5/1995 Krishnamoorthy ...... G06K 9/74
365/49.17
5,694,249 A 12/1997 Misawa
(Continued)

FOREIGN PATENT DOCUMENTS

JP 61-131247 A 6/1986
JP 2-179937 A 7/1990
(Continued)

OTHER PUBLICATIONS

E. N. Glezer, et. al., "Three-dimensional optical storage inside transparent materials", Opt. Lett., vol. 21, No. 24, pp. 2023 to 2025 (1996).
(Continued)

*Primary Examiner* — Brian Butcher
(74) *Attorney, Agent, or Firm* — Mattingly & Malur, PC (57) ABSTRACT In a recording technique in which a plurality of light spots are simultaneously formed by using an ultra-short pulse laser and a spatial phase modulator, and a plurality of recording dots having refractive indexes different from those of the vicinities thereof are formed inside a recording medium, it is hard to make recording quality and a recording density compatible. Therefore, a plurality of dots are recorded at a predetermined dot pitch, and then other dots are recorded between the recorded dots.

11 Claims, 9 Drawing Sheets (51) Int. Cl.
*G11B 7/128* (2012.01)
*G11B 7/0045* (2006.01)
*G11B 7/013* (2006.01)

(52) U.S. Cl.
CPC .............. *G11B 7/013* (2013.01); *G11B 7/128* (2013.01); *G11C 13/048* (2013.01)

(56) References Cited

U.S. PATENT DOCUMENTS

| | | | |
|---|---|---|---|
| 5,761,111 A | 6/1998 | Glezer | |
| 2005/0041270 A1* | 2/2005 | Yasuda | G03H 1/26 359/1 |
| 2005/0231775 A1* | 10/2005 | Kubota | G03H 1/0402 359/15 |
| 2005/0270609 A1* | 12/2005 | Chuang | G11B 7/0065 359/22 |
| 2009/0147654 A1* | 6/2009 | Malki | G11B 7/0065 369/103 |

FOREIGN PATENT DOCUMENTS

| | | |
|---|---|---|
| JP | 3-183027 A | 8/1991 |
| JP | 2010-184265 A | 8/2010 |
| JP | 2012-226268 A | 11/2012 |

OTHER PUBLICATIONS

E. N. Glezer, et. al., "Ultrafast-laser driven micro-explosions in transparent materials", Appl. Phys. Lett. vol. 71, No. 7, pp. 882 to 884 (1997).

M. Sakakura, et. al., "Improved phase hologram design for generating symmetric light spots and its application for laser writing of waveguides", Opt. Lett., vol. 36, No. 7, pp. 1065 to 1067 (2011).

Hitachi news :Sekiei Glass no Naibu ni CD Nami Yoryo no Digital Data o Kiroku Saisei suru Gijutsu o Kaihatsu, Hitachi, Ltd., Sep. 24, 2012.

International Search Report of PCT/JP2012/083195.

* cited by examiner

OPTICAL RECORDING DEVICE, OPTICAL RECORDING METHOD, AND INFORMATION RECORDING MEDIUM

TECHNICAL FIELD

The present invention relates to an apparatus which records information on a medium by using light, an optical recording method, and an information recording medium.

BACKGROUND ART

It is known that a minute deformed region of which a refractive index is different from that of the vicinity thereof is formed if short pulse laser is condensed inside a transparent medium such as quartz glass. A technique has been examined in which a plurality of such minute deformed regions are formed inside the medium in a three-dimensional manner and are used for recording information. PTLs 1 and 2 and NPLs 1 and 2 disclose a three-dimensional memory in which a recording mark with a refractive index different from that of peripheral glass is locally formed in glass or the like. A mechanism in which local deformation occurs due to short pulse laser is disclosed in, for example, NPL 3. NPL 3 discloses a technique in which a plurality of light spots are formed by using a femtosecond laser and a spatial phase modulator, and an optical waveguide is formed inside a transparent material such as quartz glass. The continuity of the waveguide is improved by changing the number of pattern elements of the light spots depending on a shape of the formed waveguide. In addition, NPL 4 discloses a technique in which simultaneous multi-bit recording in fused silica (quartz glass) is performed by using a femtosecond laser and a spatial phase modulator, and shows a result of quantitative evaluation using SNR.

CITATION LIST

Patent Literature

PTL 1: U.S. Pat. No. 5,694,249
PTL 2: U.S. Pat. No. 5,761,111
PTL 3: JP-A-2010-184265

Non-Patent Literature

NPL 1: E. N. Glezer, et. al., "Three-dimensional optical storage inside transparent materials", Opt. Lett., Vol. 21, No. 24, pp. 2023 to 2025 (1996)
NPL 2: E. N. Glezer, et. al., "Ultrafast-laser driven micro-explosions in transparent materials", Appl. Phys. Lett. Vol. 71, No. 7, pp. 882 to 884 (1997)
NPL 3: M. Sakakura, et. al., "Improved phase hologram design for generating symmetric light spots and its application for laser writing of waveguides", Opt. Lett., Vol. 36, No. 7, pp. 1065 to 1067 (2011)
NPL 4: M. Shiozawa, et al., "Simultaneous Multi-Bit Recording in Fused Silica for Permanent Storage", Proc. International Symposium on Optical Memory 2012, pp. 26 to 27 (2012)

SUMMARY OF INVENTION

Technical Problem

In a case where the above-described techniques are applied to a storage, there is a problem in terms of compatibility between recording quality and recording density. If dots are simultaneously formed with a plurality of light spots, it has been newly proved that dots are destroyed or dots are omitted according to approaching of the spots to each other, and thus recording quality deteriorates. On the other hand, if an interval between the spots is intended to be secured, an interval between recording dots is increased, and thus a recording density is reduced. However, the compatibility between the recording quality and the recording density is not taken into consideration in any related art, and it may not be possible to achieve both high reliability and high density recording.

Solution to Problem

Therefore, in the present specification, the following configurations are employed.

(1) In an information recording method, a plurality of dots which have refractive indexes different from refractive indexes of the vicinities thereof and have a predetermined dot pitch are simultaneously formed by applying laser light to inside of a recording medium via a spatial phase modulator to which a two-dimensional pattern is applied, and then next dots are formed between the formed dots.

(2) An information recording apparatus includes a laser light source; a stage on which a recording medium is placed; a spatial phase modulator that is provided between the laser light source and the stage and to which a two-dimensional pattern for recording dots in the recording medium is applied; a condensing optical system that collects laser light so as to form a plurality of light spots corresponding to the two-dimensional pattern, and forms a plurality of dots having a predetermined dot pitch inside the recording medium; and means for changing recording positions so that other dots are recorded between the recorded dots.

Advantageous Effects of Invention

As mentioned above, recording quality and a recording density can be made compatible by recording the next dots between recorded dots.

DESCRIPTION OF EMBODIMENTS

Hereinafter, an embodiment of the present invention will be described later in detail with reference to the drawings.

Example 1

Figure 1A:
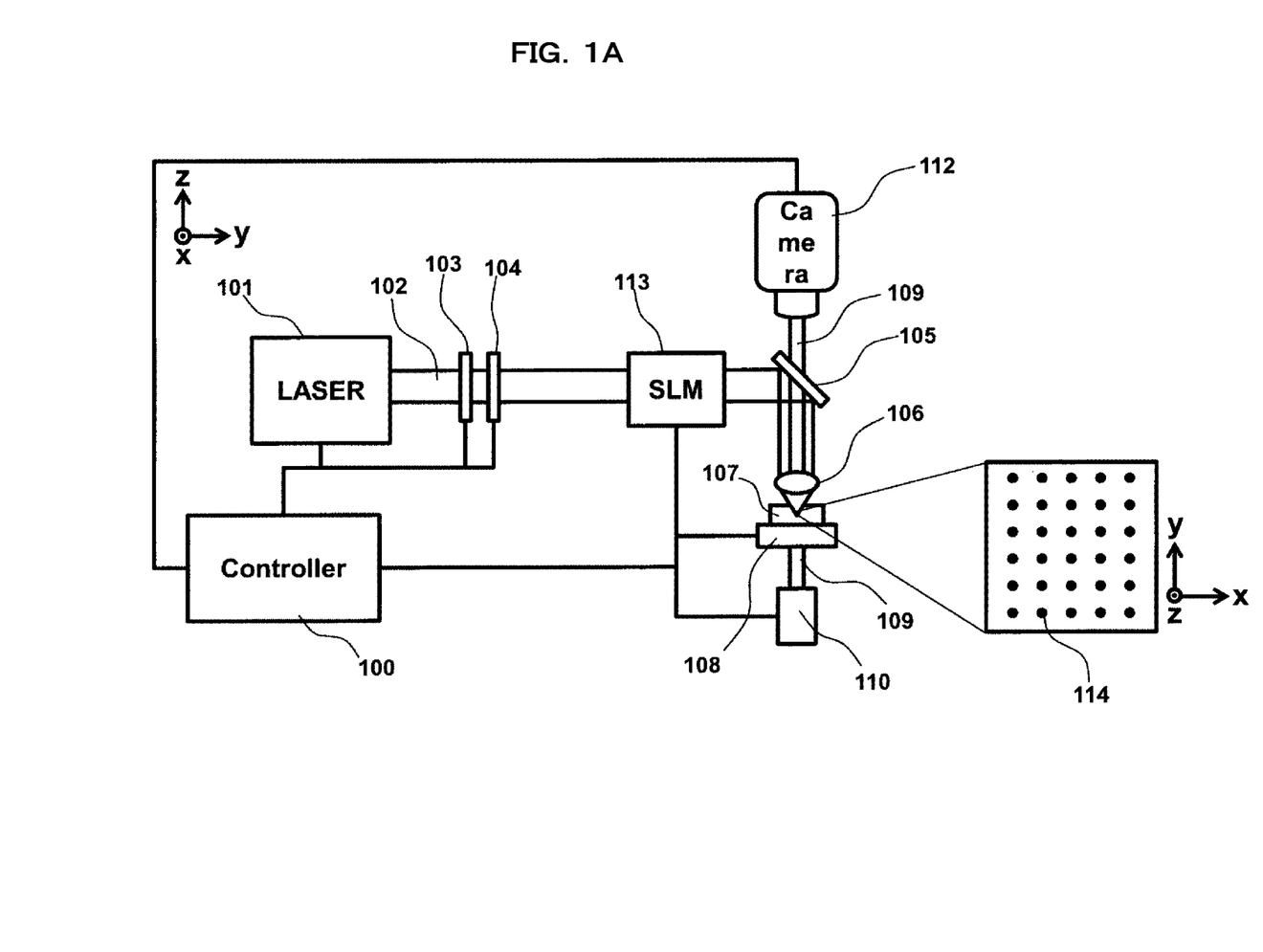
FIG. 1A is a diagram illustrating a configuration example of a recording apparatus according to the present example.

FIG. 1A is a diagram illustrating a configuration example of an apparatus used for a recording method of the present invention. The present apparatus includes a recording optical system, a reproduction optical system, and a controller 100 which controls the entire apparatus. First, the recording optical system will be described. A laser 101 emits laser light 102. The laser 101 may be, for example, a short pulse laser which has high peak power and can cause a nonlinear optical effect, such as a titanium sapphire laser, a Q-switch YAG laser, or a fiber laser. A shutter 103 or an attenuator 104 performs control of irradiation of a recording medium 107 with the laser light 102 or power control. In addition, the shutter 103 and the attenuator 104 may be built into the laser 101, and the same function thereof may be realized by combining a wavelength plate with a polarization plate. A spatial phase modulator 113 changes a phase of the incident laser light 102 for each region on the basis of a hologram pattern applied by the controller 100. The spatial phase modulator 113 may be implemented, for example, by providing a plurality of liquid crystal elements in a lattice form and by changing an orientation for each liquid crystal element. Further, herein, although an example in which the spatial phase modulator 113 transmits the laser light 102 therethrough is described, phase modulation may be performed by the spatial phase modulator 113 reflecting the laser light 102. A dichroic mirror 105 reflects the laser light 102 and transmits reproduction light 109 (which will be described later) therethrough. The laser light 102 is collected on the recording medium 107 by a lens 106, and thus multiple spots formed of a plurality of light spots 114 corresponding to the hologram pattern applied to the spatial phase modulator 113 are formed in an xy surface. A plurality of dots are simultaneously recorded inside or on a surface of the recording medium 107 by using the formed multiple spots. It is possible to record any number of dots at any positions by changing a hologram pattern applied to the spatial phase modulator. Further, an example of the recording medium 107 may include a medium which transmits the laser light 102 therethrough, such as quartz crystal. A stage 108 controls a position of the recording medium 107 by using, for example, a piezo-motor or a stepping motor.

Figure 1B:
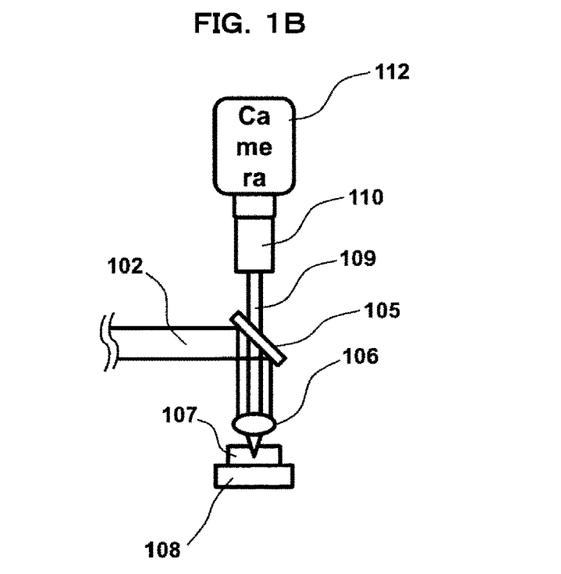
FIG. 1B is a diagram illustrating a configuration example of a reproduction optical system according to the present example.
Figure 1C:
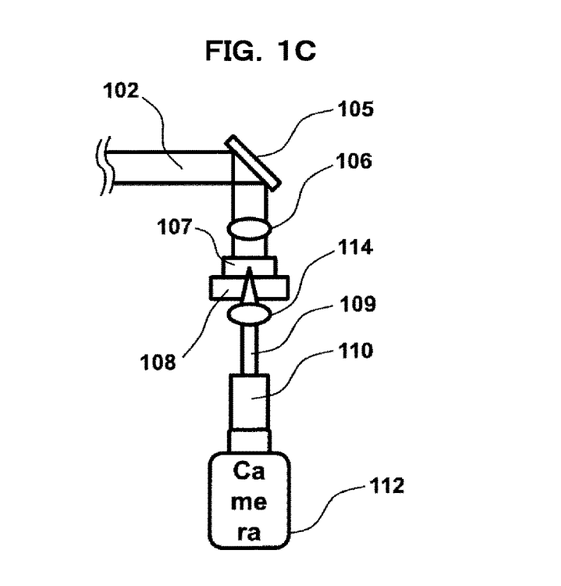
FIG. 1C is a diagram illustrating another configuration example of the reproduction optical system according to the present example.

Next, the reproduction optical system will be described. A reproduction light source 110 emits the reproduction light 109. The reproduction light source may include an LED, a semiconductor laser, or the like. The reproduction light 109 is transmitted through the recording medium 107 and is collected at a camera 112. The camera 112 can monitor recorded dots and the vicinities thereof through observation from an incidence direction (z direction) of the laser light 102. The camera 112 outputs a monitored image to the controller 100. The controller 100 measures the brightness of the dots and the vicinity thereof on the basis of the input image. In addition, on the basis of the measured brightness, an error rate or SNR which will be described later is calculated, and a signal process, decoding, or the like is performed so that data is reproduced. FIGS. 1B and 1C are diagrams illustrating other configuration examples of the reproduction optical system. As illustrated in FIGS. 1B and 1C, the reproduction light source 110 and the camera 112 may be provided on the same side with respect to the recording medium, and dots may be monitored by using the reproduction light 109 reflected from the recording medium. As illustrated in FIG. 1C, in a case where the reproduction light 109 is applied so as to oppose the laser light 102, the reproduction light 109 may be collected at the recording medium by using a condensing lens 114. Further, the reproduction light source 110 is not necessarily provided, and external natural light or the like may be used. Still further, the reproduction optical system may not be accompanied by the recording optical system, and dots may be monitored by using a separate reproduction optical system having the same configuration, an optical microscope, or the like.

Figure 2A:
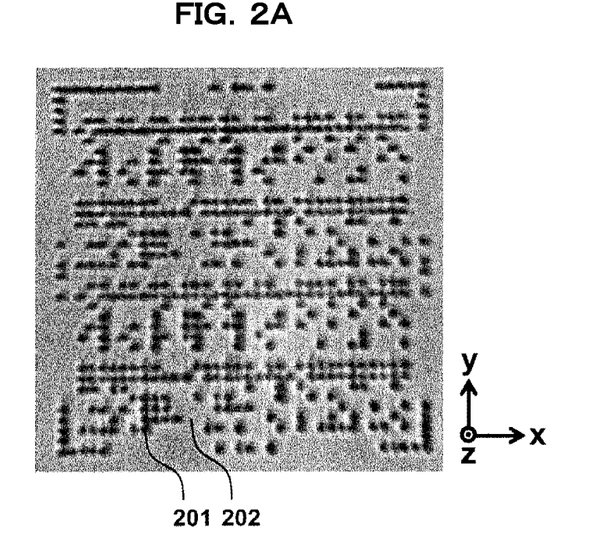
FIG. 2A illustrates an example of a microscopic image of a recording medium in which dots have been recorded.

FIG. 2A illustrates an example of a microscopic image of the recording medium 107 in which dots are recorded. A region where the laser light 102 is collected can be observed as a dot 201, and it is possible to record and reproduce digital data by correlating the presence or absence of the dot 201 with data of 0 and 1. In addition, an error rate or SNR can be calculated as follows as an evaluation index of recording and reproduction quality on the basis of a monitored image. The error rate is calculated by setting a threshold value in the brightness so as to determine data of 0 and 1 and comparing the determined data with original data. When setting a difference in the average brightness between the dots and spaces 202 as signal amplitude, and setting a value, as noise, obtained through RMS adding of a standard deviation of the brightnesses of the dots and spaces, the SNR is calculated according to Equation 1.

$$SNR = 20 \log [\sqrt{(\sigma_d^2 + \sigma_s^2)}/|V_d - V_s|] \qquad \text{[Equation 1]}$$

In Equation 1, $\sigma_d$ and $\sigma_s$ respectively indicate brightness deviations of the dots and the spaces, and $V_d$ and $V_s$ respectively indicate average brightnesses of the dots and the spaces. In addition, the root indicates an operation taken for $(\sigma_d^2 + \sigma_s^2)$, and $|V_d - V_s|$ indicates an absolute value. Further, herein, an example is described in which the dots are recorded in the xy surface and thus a single recording layer is formed, but a plurality of recording layers may be formed at different positions in the Z direction. If a plurality of recording layers are formed, it is possible to improve the recording capacity more than in a single layer. As a method of forming a plurality of recording layers, for example, there is a method of moving the stage 108 or changing a hologram pattern applied to the spatial phase modulator 113.

Figure 2B:
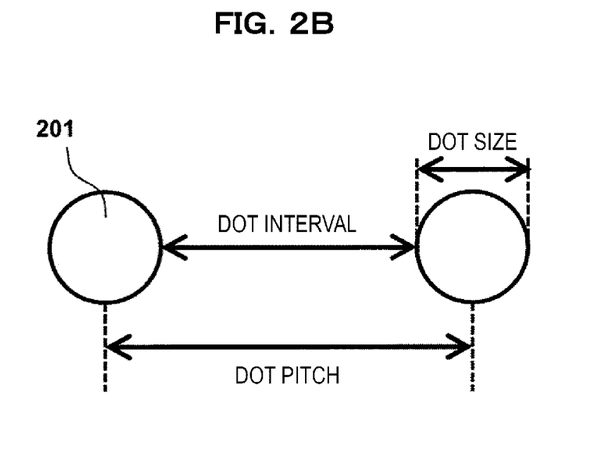
FIG. 2B is a diagram illustrating definition of a dot pitch and a dot interval.
Figure 3:
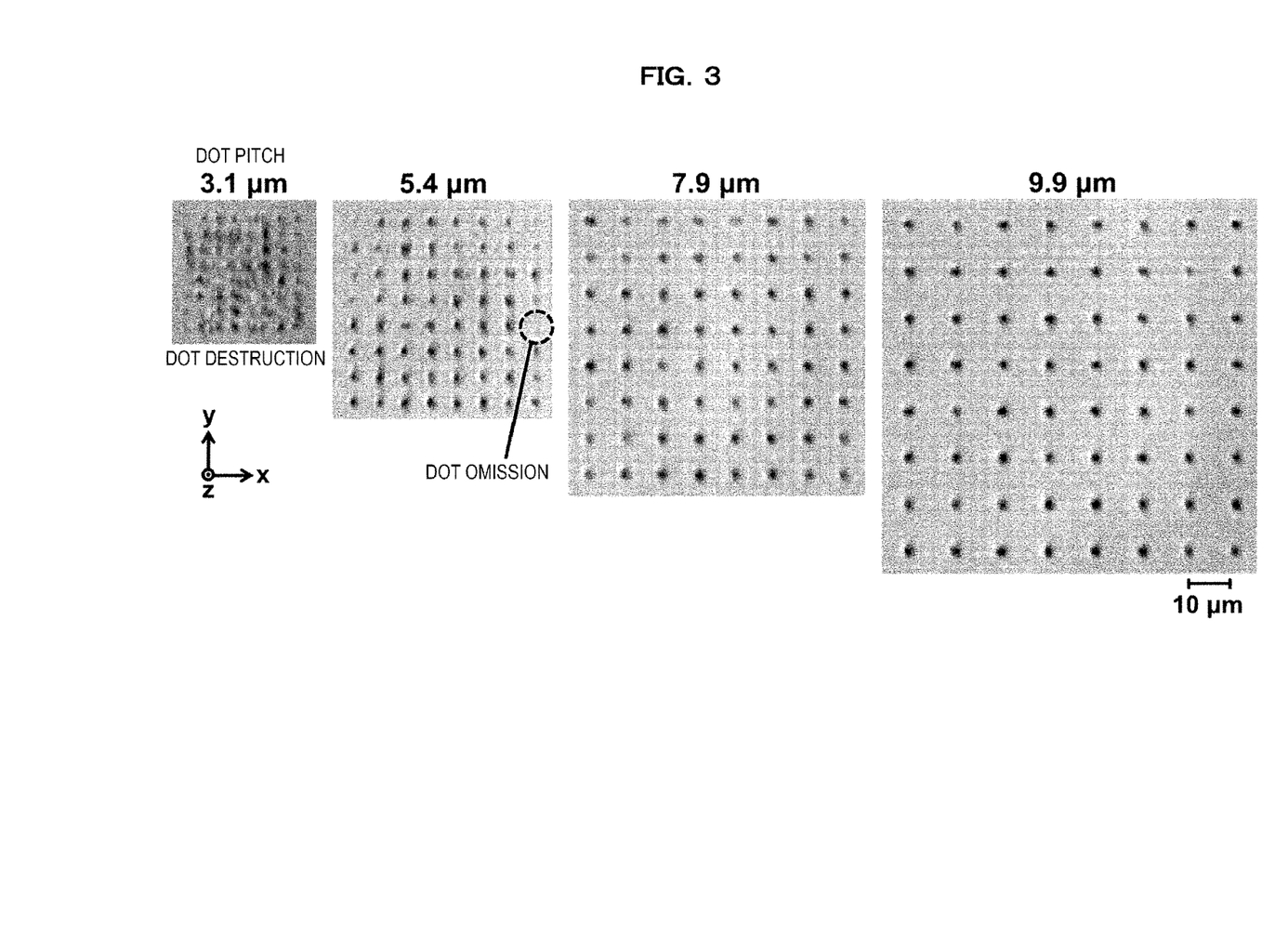
FIG. 3 illustrates examples of a microscopic image of a recording medium in which 64 dots have been simultaneously recorded by changing dot pitches.

FIG. 2B is a diagram illustrating definition of an index for quantifying a distance between dots. A distance between a central position of the dot 201 and a central position of an adjacent dot is defined as a "dot pitch". In addition, a distance between an edge position of the dot 201 and an edge position of the adjacent dot is referred to as a "dot interval". Here, for example, in a brightness profile of the dot, the edge position is a position at which the brightness is the same as the brightness of a space or a non-recording region, or a position at which the brightness changes by 10% relative to the brightness of the space or the non-recording region. In addition, a distance between one edge position of the dot and the other edge position thereof is defined as a "dot size". FIG. 3 illustrates examples of a microscopic image of a medium in which 64 dots have been simultaneously recorded by changing dot pitches. In a case where a dot pitch is 3.1 µM, dot destruction or dot connection occurs. Further, also in a case of 5.4 μm, a dot size or brightness is nonuniform, and some dots are omitted. These show deterioration in recording quality, which may be caused by a spot intensity change due to light interference between multiple spots, or may be caused by interaction between dots during formation of the dots.

Figure 4:
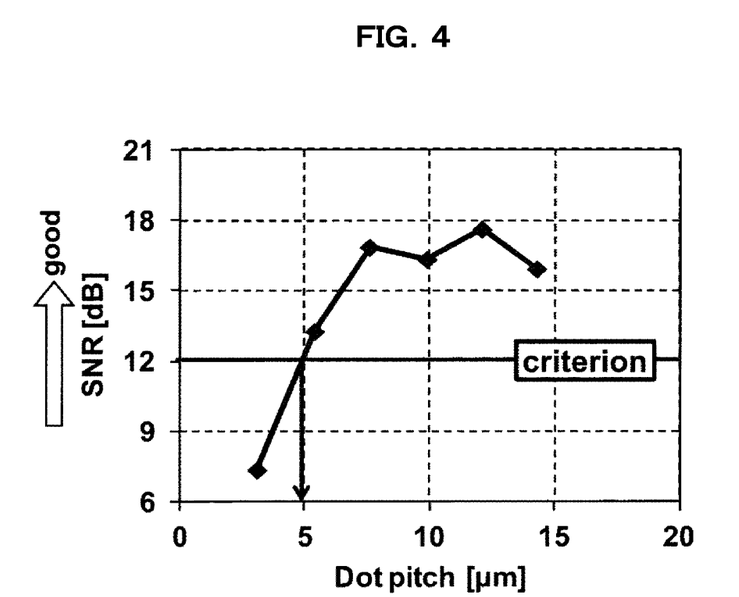
FIG. 4 is a diagram illustrating an example of a relationship between a dot pitch and SNR.

FIG. 4 is a diagram illustrating a relationship between a dot pitch and SNR on the basis of FIG. 3. The SNR increases according to an increase in the dot pitch, and thus the dot pitch is required to be increased in order to ensure recording quality. In addition, the relationship illustrated in FIG. 4 is changed due to a configuration of the recording optical system, recording power, or the like and is thus excluded.

Figure 5A:
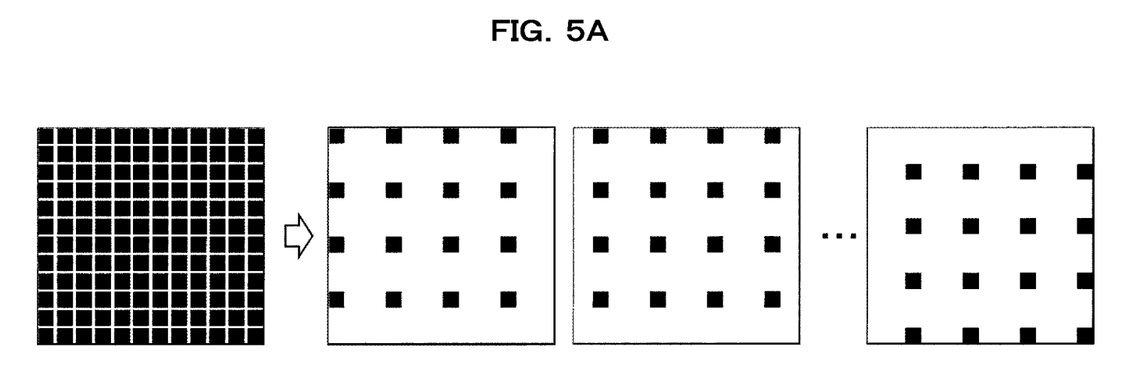
FIG. 5A is a diagram illustrating an example of a method of dividing a recording pattern.
Figure 5B:
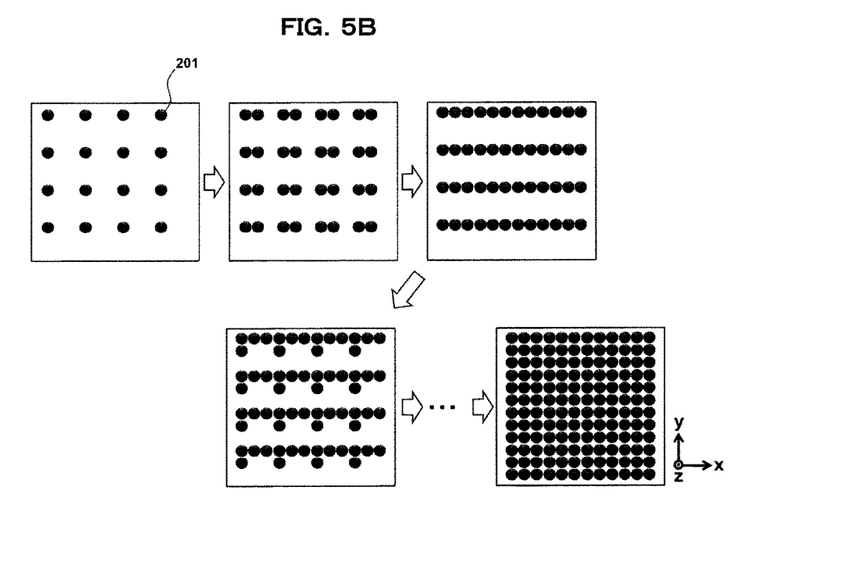
FIG. 5B is a diagram illustrating an example of a recording procedure according to the present example.

FIGS. 5A and 5B are diagrams illustrating an example of a recording method according to the present invention. As illustrated in FIG. 5A, a desired recording pattern is divided into a plurality of patterns so as to cause a dot pitch for ensuring recording quality. Next, as illustrated in FIG. 5B, simultaneous recording is performed with the separate patterns, and simultaneous recording is performed again after changing recording positions. This is repeatedly performed multiple times, and thus it is possible to ensure recording quality and to achieve a desired recording density. As means for changing recording positions, it is simple and preferable to change positions of multiple spots generated by the spatial phase modulator, but a position of a recording medium may be changed by moving the stage by using a piezo-motor or a stepping motor. In addition, FIG. 5 illustrates an example of the recording pattern which whole recording area is occupied with dots, but the present recording method is applicable to any recording pattern.

Figure 6:
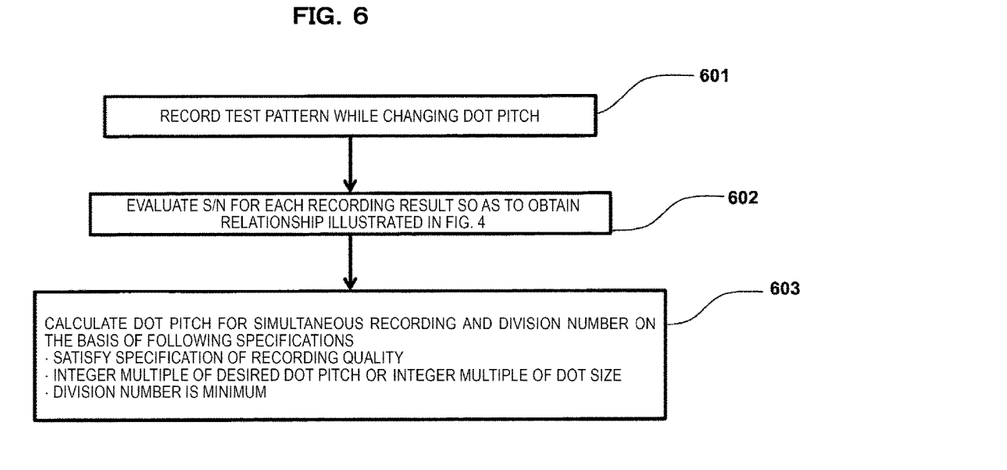
FIG. 6 is a diagram illustrating a method of determining a number of divisions of the recording pattern.

FIG. 6 is a diagram illustrating a method of determining a number of divisions of a recording pattern in the recording method described in FIG. 5. In 601, as illustrated in FIG. 3, simultaneous recording is performed after changing a dot pitch. As a region for performing recording, for example, a region different from a user data region is preferably used, such as a region provided for trial recording. In 602, an SNR evaluation is performed on each recording result, and a relationship between a dot pitch and SNR illustrated in FIG. 4 is acquired. In 603, under conditions that a specification of recording quality is satisfied, and a number of divisions is the minimum in an integer multiple of a desired dot pitch or an integer multiple of a desired dot size, a dot pitch and a number of divisions for simultaneous recording are derived. In the example illustrated in FIG. 4, if a criterion value of SNR is set to, for example, 12 dB, it is necessary to secure a dot pitch of 5 μm or more in order to ensure desired recording quality through simultaneous recording. In this case, there is a possibility that dot omission may occur, but data can be decoded through an error correction process. If a desired dot pitch is, for example, 2.8 μm, 5.6 μm which is twice the desired dot pitch may be used as a dot pitch for simultaneous recording, and recording may be performed twice in a division manner in the x direction and the y direction. In addition, in a case where a dot pitch for simultaneous recording is determined on the basis of an integer multiple of a dot size, for example, if a dot diameter is 2 μm, 6 μm may be used as a dot pitch for simultaneous recording, and recording may be performed three times in a division manner in the x direction and the y direction.

In addition, in FIG. 6, as an ideal example, a specification is determined so that a number of divisions is the minimum, but the present invention is not limited thereto, and irradiation may be repeatedly performed multiple times. Although the recording time is taken ultimately, dots are simultaneously recorded at edges of a recording region, and irradiation may be repeatedly performed so as to fill a gap between the gaps.

Figure 7:
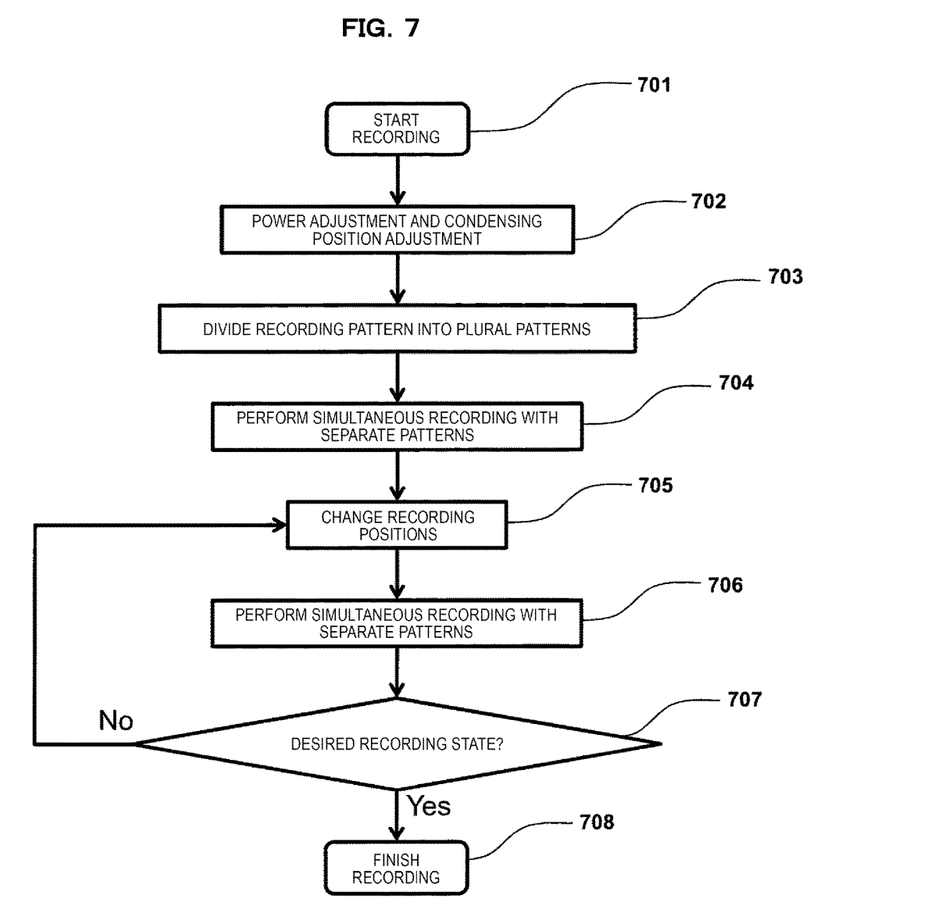
FIG. 7 is a flowchart illustrating a recording method according to the present example.

FIG. 7 illustrates an example of a flowchart until a desired recording state is obtained after recording is started. In 701, the controller 100 gives a command for starting recording. In 702, recording power or condensing positions of multiple spots are adjusted. In 703, a recording pattern is divided into a plurality of patterns according to the method described in FIG. 6. In 704, simultaneous recording is performed with the separate patterns, then recording positions are changed in 705, and simultaneous recording is performed again in 706. In 707, it is checked whether or not a recording density, a recording pattern, or the like lies in a desired state, and, if the desired state does not occur, the flow returns to 705, and the recording is continuously performed. If the desired state occurs, the recording is finished in 708.

By using the present recording method, for example, recording can be performed, for example, at a dot size of 1 μm or more, and a dot interval of 1 μm to 2 μm. If this recording condition is employed, reproduction can be performed at high SNR even by using a simple microscope, and the recording condition is put into practical use since a predetermined recording density can be secured. In addition, NPL 2 discloses that a dot diameter is 200 nm to 250 nm, and a dot interval is 1 μm, 2 μm, and 3 μm, but irradiation is not performed through pattern division unlike in the present specification, and thus a recording pattern as in the present specification cannot be obtained.

Figure 8:
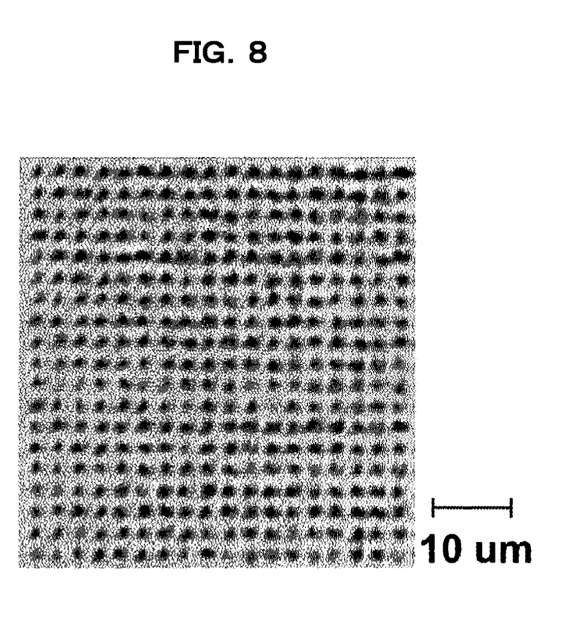
FIG. 8 illustrates an example of a microscopic image of a medium on which recording has been performed according to the present example.

FIG. 8 illustrates an example of a microscopic image of a medium on which recording has been performed according to the recording method of the present invention. A dot pitch for simultaneous recording was 8.4 μm, and a dot pitch became 2.8 μm by repeatedly performing simultaneous recording nine times while changing condensing positions. Under this condition, a dot size becomes about 1.5 μm, and a dot interval becomes about 1.3 μm. Therefore, a recording density and recording quality are compatible according to the present recording method.

REFERENCE SIGNS LIST

100: CONTROLLER, 101: LASER, 102: LASER LIGHT, 103: SHUTTER, 104: ATTENUATOR, 105: DICHROIC MIRROR, 106: LENS, 107: RECORDING MEDIUM, 108: STAGE, 109: REPRODUCTION LIGHT, 110: REPRODUCTION LIGHT SOURCE, 112: CAMERA, 113: SPATIAL PHASE MODULATOR, 114: CONDENSING LENS, 201: DOT, 202: SPACE

The invention claimed is:

1. An optical recording method comprising:
a first step of simultaneously forming a plurality of dots, which have refractive indexes different from refractive indexes of the vicinities thereof and have a predetermined dot pitch, in a single plane of a recording medium by applying laser light to inside of the recording medium via a spatial phase modulator to which a two-dimensional pattern is applied; and
a second step, after the first step, of forming a plurality of next dots between neighboring ones of the formed dots formed in the first step in a same region of the single plane as the formed dots formed in the first step.

2. The optical recording method according to claim 1, wherein the second step of forming the next dots is executed by changing a pattern of the spatial phase modulator.

3. The optical recording method according to claim 1, wherein the second step of forming the next dots is also a step of simultaneously forming a plurality of dots.

4. The optical recording method according to claim 1, wherein the predetermined dot pitch is 5 μm or more.

5. The optical recording method according to claim 1, wherein the second step of forming the next dots is repeatedly executed.

6. The optical recording method according to claim 1, wherein the predetermined dot pitch is determined on the basis of the following steps of:
   (a) recording a test pattern while changing a dot pitch;
   (b) evaluating recording quality for each dot pitch; and
   (c) determining a dot pitch for which the recording quality is a predetermined level or higher as a result of the evaluation.

7. The optical recording method according to claim 6, wherein, in the step of (c), the dot pitch is determined so that a number of divisions is the minimum.

8. An optical recording apparatus comprising:
   a laser light source;
   a stage on which a recording medium is placed;
   a spatial phase modulator that is provided between the laser light source and the stage and to which a two-dimensional pattern for recording dots in the recording medium is applied;
   a condensing optical system that forms a plurality of light spots corresponding to the two-dimensional pattern and forms a plurality of dots having a predetermined dot pitch in a single plane inside the recording medium; and
   means for changing recording positions so that a plurality of next dots are recorded between neighboring ones of the recorded dots in a same region of the single plane as the recorded dots after forming the recorded dots.

9. The optical recording apparatus according to claim 8, wherein the means for changing recording positions is realized by changing a pattern of the spatial phase modulator.

10. The optical recording apparatus according to claim 8, wherein the means for changing recording positions is realized by moving the stage.

11. An optical recording apparatus comprising:
   a laser light source;
   a stage on which a recording medium is placed;
   a spatial phase modulator that is provided between the laser light source and the stage and to which a two-dimensional pattern for recording dots in the recording medium is applied; and
   a condensing optical system that forms a plurality of light spots corresponding to the two-dimensional pattern and forms a plurality of dots having a predetermined dot pitch in a single plane inside the recording medium,
   wherein the spatial phase modulator is configured to change recording positions so that a plurality of next dots are recorded between neighboring ones of the recorded dots in a same region of the single plane as the recorded dots after forming the recorded dots.

* * * * *